United States Patent [19]

Ito

[11] Patent Number: 5,682,120

[45] Date of Patent: Oct. 28, 1997

[54] DIFFERENTIAL AMPLIFIER CIRCUIT USING LATERAL-TYPE BIPOLAR TRANSISTORS WITH BACK GATES

[75] Inventor: Takao Ito, Tokyo, Japan

[73] Assignee: Kabushiki Kaisha Toshiba, Tokyo, Japan

[21] Appl. No.: 618,746

[22] Filed: Mar. 20, 1996

[30] Foreign Application Priority Data

Mar. 22, 1995 [JP] Japan .................. 7-062224

[51] Int. Cl.$^6$ ............................................. H03F 3/45
[52] U.S. Cl. ...................... 330/252; 330/253; 330/260; 330/300; 330/307
[58] Field of Search ......................... 330/252, 253, 330/260, 300, 307; 257/378

[56] References Cited

U.S. PATENT DOCUMENTS 4,232,270  11/1980  Marmet et al. .............. 330/262 X

FOREIGN PATENT DOCUMENTS 63-136669  6/1988  Japan.
613396     1/1994  Japan.

*Primary Examiner*—James B. Mullins
*Attorney, Agent, or Firm*—Loeb & Loeb LLP

[57] ABSTRACT

A differential amplifier circuit of the present invention includes a device ("transistor") having a back gate electrode formed above the base region of a bipolar transistor between the emitter and collector regions. The back gate electrode of one such transistor is connected to the collector or emitter of another transistor in order to provide positive feedback so that the operation of each transistor is enhanced. The operational speed of the transistors is increased and the amplification factor of the differential amplifier circuit is improved to provide stabilized circuit operation. Accordingly, the degree of circuit integration and the operational stability of the differential amplifier are enhanced as compared with a differential amplifier circuit constructed of conventional bipolar transistors or FETs.

21 Claims, 3 Drawing Sheets

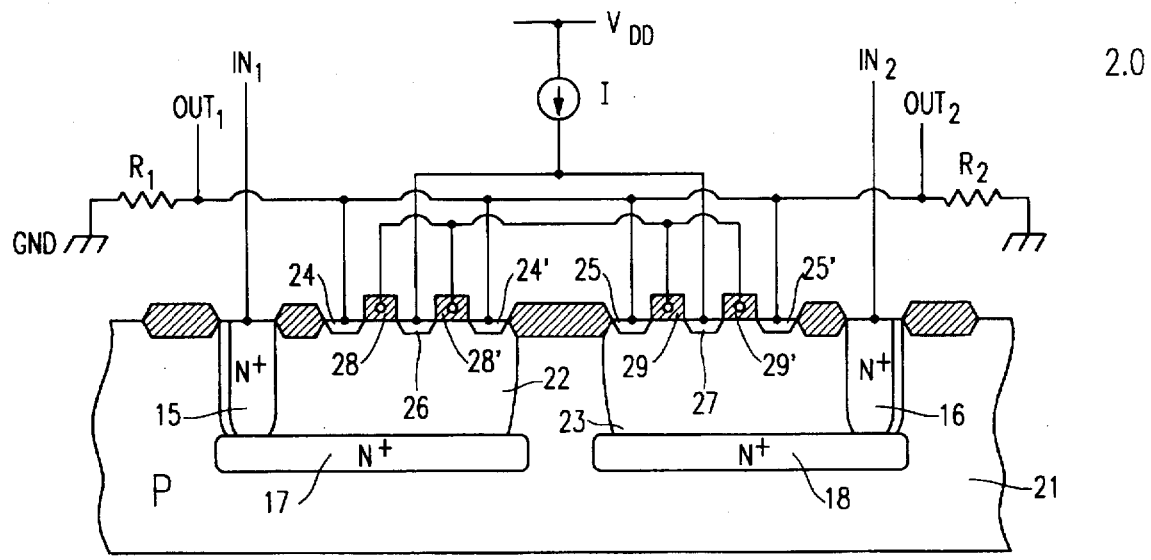
FIG. 3
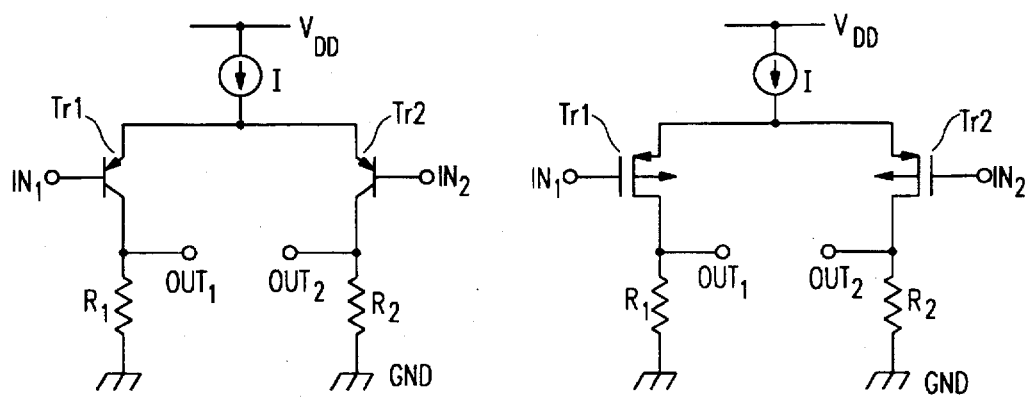
FIG. 4
PRIOR ART
FIG. 5
PRIOR ART

DIFFERENTIAL AMPLIFIER CIRCUIT USING LATERAL-TYPE BIPOLAR TRANSISTORS WITH BACK GATES

FIELD OF THE INVENTION

The present invention relates to a differential amplifier circuit and more particularly to a differential amplifier circuit that uses a lateral-type bipolar transistor that has a back gate.

Background of the Invention

Differential amplifier circuits have been used in many analog circuits. A differential amplifier circuit typically inputs two potentials at bases or gates of two transistors, amplifies the difference between the two input potentials, and then outputs the amplified potential difference. The total current flowing through the two transistors is regulated.

A differential amplifier is contacted using either bipolar transistors or field effect transistors (hereinafter, FETs). In a normal integrated circuit (hereinafter, IC), respective circuit elements are built up adjacent to one another in the same chip. Thus, when the temperature of the chip varies, the parameters (such as amplification factor) of the differential amplifier's two transistors vary in substantially the same way. Accordingly, differential amplifiers constructed on a chip have characteristics such that the circuit balance is maintained to provide a stable operation.

To insure proper operating characteristics, differential amplifier circuits should be made of elements that are minimally affected by variations in base current and the like. Such amplifiers should also have a sufficient current amplification factor to perform stable circuit operation. The amplification factor of a differential amplifier is expressed as gm×R, where gm represents the conductance of a transistor and R represents the resistance of a load connected between the collector or emitter of the transistor (source or drain when using FETs) and a ground potential. The conductance gm varies in accordance with the amount of collector (drain) current.

FIG. 4 shows an example of a differential amplifier circuit constructed using bipolar transistors. As shown in FIG. 4, the base terminals of two transistors Tr1 and Tr2 are connected to two input potentials IN1 and IN2. The emitter terminals are connected to a constant current source I so that the total emitter current of the two transistors Tr1 and Tr2 is regulated to be a constant value (i.e., I). The collector terminals of the two transistors Tr1 and Tr2, which provide the output potentials OUT1 and OUT2 (respectively), are coupled to ground potential through resistors R1 and R2, respectively. Each output potential (OUT1 or OUT2) is expressed as the collector current of the corresponding transistor (Tr1 or Tr2) multiplied by the corresponding resistance (R1 or R2).

If transistors having high amplification factors are used in the differential amplifier, stable characteristics that are unaffected by the base current of the transistors can be obtained. In order to enhance the amplification factor of the differential amplifier circuit, the current driving capability of each transistor must be increased. However, if a lateral-type PNP transistor is used, the device size must be made large to increase the current driving capability. This is because the current driving capability of a lateral-type PNP transistor is inherently low. Furthermore, if a vertical-type NPN transistor is used, the manufacturing cost is greatly increased, even though some degree of current driving capability can be obtained when the device size is small. When a differential amplifier is constructed using bipolar transistors, it is difficult to maintain circuit stability due to the effect of the base current. To overcome this problem, an increase in manufacturing cost and/or device size is necessary.

FIG. 5 shows an example of a differential amplifier circuit constructed using FETs. As shown in FIG. 5, the gate terminals of two transistors Tr1 and Tr2 are connected to two input potentials IN1 and IN2. The source terminals are connected to a constant current source I so that the total source current of the two transistors Tr1 and Tr2 is regulated to be a constant value (i.e., I). The drain terminals of the two transistors Tr1 and Tr2, which provide the output potentials OUT1 and OUT2 (respectively), are coupled to ground potential through resistors R1 and R2, respectively. Each output potential (OUT1 or OUT2) is expressed as the drain current of the corresponding transistor (Tr1 or Tr2) multiplied by the corresponding resistance (R1 or R2).

As compared with the differential amplifier constructed using bipolar transistors shown in FIG. 4, the input (gate) of the differential amplifier shown in FIG. 5 has a higher impedance. Thus, current variation of a pre-stage circuit (not shown) has little effect on the differential amplifier constructed using FETs. However, FETs generally have less current driving capability than bipolar transistors. Additionally, it is difficult to make the characteristics of the two FETs sufficiently coincident. Therefore, such a differential amplifier circuit has a stability problem.

Accordingly, when a differential amplifier circuit is constructed using conventional FETs or bipolar transistors, there are problems such as circuit instability, an increase in manufacturing cost, and an increase in device size.

In order to enhance the current amplification factor of transistors and improve the integration of transistors, there has recently been studied a semiconductor device with a structure such that a MOS (Metal Oxide Semiconductor) structure is formed on the substrate surface of a lateral-type bipolar transistor. When a predetermined voltage is applied to the electrodes of such a device, a high current amplification factor is obtained. The structure of this device is disclosed in Japanese Laid-Open Patent Application No. 63-136669 (Japanese Patent Application No. 61-284671, filed Nov. 28, 1986) and Japanese Laid-Open Patent Application No. 6-013396 (Japanese Patent Application No. 4-165909, filed Jun. 24, 1992). A semiconductor device as disclosed in these laid-open patent applications includes a lateral-type transistor and a gate electrode. The lateral-type transistor has a base region formed of a semiconductor substrate, and emitter and collector regions (which have a conductivity type opposite to that of the base region) formed in parallel on the base region. The gate electrode (hereinafter, referred to as a "back gate") is formed by a conductive layer that overlies an insulating film that is formed between the emitter and collector regions on the surface of the semiconductor substrate, which forms the base region. The back gate is supplied with such a voltage as to change the base region to the opposite conductivity type, whereby the potential of the base region between the emitter region and the collector region is reduced. This enhances injection efficiency from the emitter and widens the channel region to thereby obtain a high current amplification factor for the device.

As described above, in a differential amplifier circuit constructed using conventional bipolar transistors, the circuit stability is insufficient due to the effect of the base current. In order to overcome this problem, an increase in manufacturing cost and an increase in device size are necessary. Furthermore, in a differential amplifier circuit constructed using conventional FETs, the amplification factor of the differential amplifier circuit is insufficient and it is difficult to make the characteristics of two transistors sufficiently coincident. Therefore, there is a problem with circuit instability in a differential amplifier comprised of conventional FETs.

SUMMARY OF THE INVENTION

It is an object of the present invention to provide a differential amplifier circuit that uses a lateral-type bipolar transistor with a back gate electrode, which is formed over an insulating film located between the emitter and collector regions, in order to enhance the degree of circuit integration and provide a differential amplifier with stable operating characteristics.

To achieve the above object, each transistor used in the differential amplifier of the present invention consists of a device having a back gate formed on the base region of a bipolar transistor between the emitter and collector regions. Additionally, each back gate is connected to the collector or emitter of the other transistor so that a positive feedback is performed in such a direction that the operation of each transistor is enhanced. As a result of this design, the transistors can operate at high speed and the amplitude of the output can be magnified. Accordingly, the amplification factor of the differential amplifier circuit can be enhanced and circuit operation can be stabilized.

Other objects, features, and advantages of the present invention will become apparent from the following detailed description. It should be understood, however, that the detailed description and specific examples, while indicating preferred embodiments of the invention, are given by way of illustration only and various modifications may naturally be performed without deviating from the gist of the present invention.

BRIEF DESCRIPTION OF THE DRAWINGS

FIG. 3 is a cross-sectional view showing transistors used in a second embodiment of the present invention;

FIG. 4 is a circuit diagram showing a conventional differential amplifier circuit;

FIG. 5 is a circuit diagram showing another conventional differential amplifier circuit;

DETAILED DESCRIPTION OF THE PREFERRED EMBODIMENTS

Embodiments of the present invention will now be described in detail with reference to the accompanying drawings.

Each transistor used in the differential amplifier circuit of the present invention is equivalent to a bipolar transistor in combination with a FET. The gate of the FET (i.e., the "back gate") is used and the device is represented by a symbol which is a combination of the bipolar transistor symbol and the FET symbol.

Figure 1:
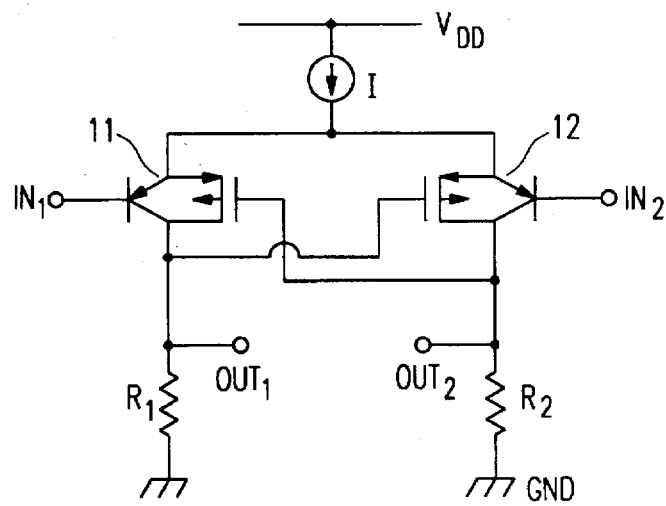
FIG. 1 is a circuit diagram showing a preferred embodiment of the present invention.

FIG. 1 shows an equivalent circuit for the differential amplifier of the present invention. The differential amplifier circuit of this embodiment of the present invention uses two semiconductor devices (hereinafter merely referred to as "transistors") 11 and 12, each composed of a lateral-type transistor with a back gate electrode. Each lateral-type transistor has a base region formed of a semiconductor substrate, and emitter and collector regions (which have a conductivity type opposite to that of the base region) formed in parallel in the base region (i.e., the semiconductor substrate). An insulating film is formed between the emitter and collector regions on the surface of the semiconductor substrate that forms the base region. The back gate electrode is formed by a conductive layer overlying the insulating film.

The base terminals of the two transistors 11 and 12 receive the two input potentials IN1 an IN2. The back gate electrode of the first transistor 11 is connected to the collector terminal of the second transistor 12, while the back gate electrode of the second transistor 12 is connected to the collector terminal of the first transistor 11. The emitter terminals of the two transistors 11 and 12 are connected to the output of a constant current source I. The collector terminals, which provide the output potentials OUT1 and OUT2, are each coupled to ground potential through a predetermined load element (for example, resistors R1 and R2).

The structure of the two transistors used in a differential amplifier according to a first embodiment of the present invention will now be described with reference to FIG. 2, which shows a cross-sectional view of the two transistors. In a P-type semiconductor substrate 21, $N^+$-type buried layers 17 and 18 are formed. N-type well regions 22 and 23 are formed over the buried layers 17 and 18. $N^+$-type contact regions 15 and 16 are formed in the well regions 22 and 23 so as to extend to the $N^+$-type buried layers 17 and 18. A well region (22 or 23) is used as the base region of a transistor, and the combination of a buried layer (17 or 18) and a contact region (15 or 16) is used as a contact to the base region of the transistor. Collector regions 24 and 25 and emitter regions 26 and 27, each of which have a conductivity type opposite to that of the base regions 22 and 23, are formed at the surface of the substrate so as to be spaced apart from each other. An insulating film is formed over each base region (22 or 23) between the corresponding emitter region (26 or 27) and collector region (24 and 25) of a transistor. Gate electrodes (back gates) 28 and 29 are respectively formed by a conductive layer overlying the insulating films. The collector region (24 or 25) and the emitter region (26 or 27) also respectively serve as the drain region and source region of the FET. Resisters R1 and R2, which are respectively connected to the collector regions 24 and 25, may be formed by a diffusion into the semiconductor substrate 21 or by a polycrystalline silicon film or the like on the semiconductor substrate 21. Constant current source I, which is connected to the emitter regions 26 and 27, may be formed in the same chip or outside the chip.

The structure of the two transistors used in a differential amplifier according to a second embodiment of the present invention will now be described with reference to FIG. 3, which shows a cross-sectional view of the two transistors. In FIG. 3, elements having the same function as elements of FIG. 2 are represented by the same reference numerals. In this embodiment, the structure shown in FIG. 2 is further provided with additional collector regions 24' and 25', which are formed apart from the emitter regions 26 and 27, and with additional gate electrodes (back gates) 28' and 29', which are each formed by a conductive layer overlying an insulating film on the surface of the base region (22 or 23) between the corresponding emitter region (26 or 27) and the newly provided collector region (24' or 25'). Thus, each transistor in this embodiment consists of two collector regions (24 and 24', or 25 and 25'), an emitter region (26 or 27), and two back gate electrodes (28 and 28', or 29 and 29').

Next, the connecting arrangement of the two transistors shown in the cross-sectional views of FIGS. 2 and 3 will be described.

Figure 2:
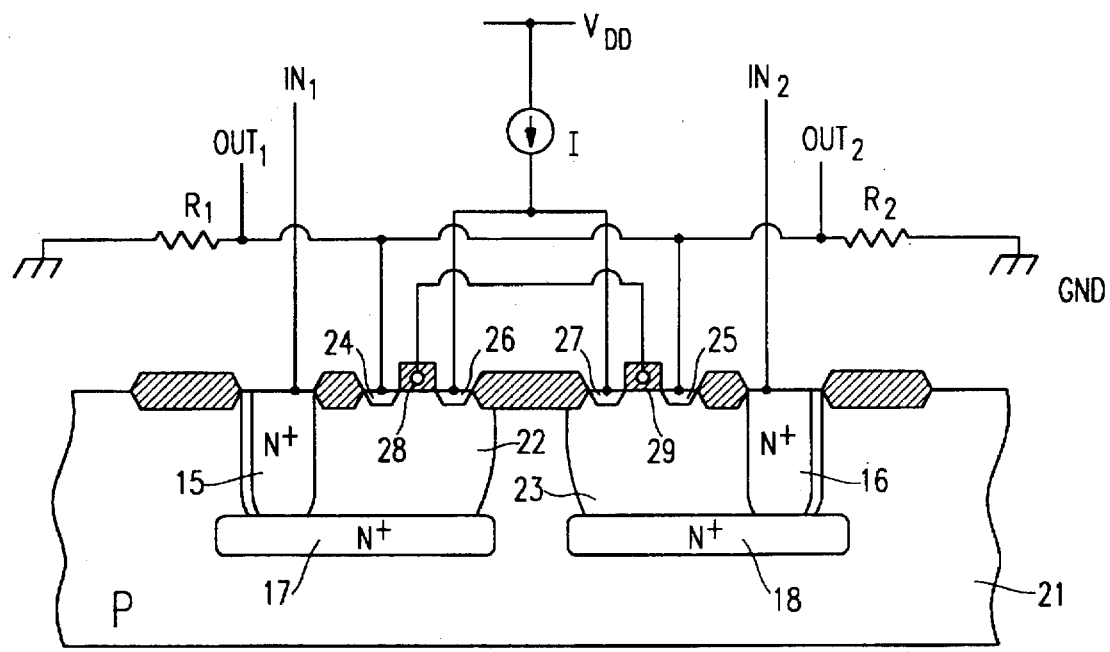
FIG. 2 is a cross-sectional view showing transistors used in a first embodiment of the present invention.

As shown in FIG. 2, the connections of the two transistors and other circuit elements that form the differential amplifier of the first embodiment are identical to those explained above for FIG. 1. Specifically, if the transistor formed on the left side of FIG. 2 is represented by Tr1 and the transistor formed on the right side is represented by Tr2, then Tr1 and Tr2 correspond to the two transistors 11 and 12 shown in FIG. 1. The back gate 28 of Tr1 is connected to the collector region 25 of Tr2 and is also coupled through a resistor R2 to ground potential An output potential OUT2 is obtained from a point between the collector region 25 of Tr2 and the resistor R2. Likewise, the back gate 29 of Tr2 is connected to the collector region 24 of Tr1 and is also coupled through resistor R1 to the ground potential Output potential OUT1 is obtained from a point between the collector region 24 of Tr1 and resistor R1. The emitter regions 26 and 27 of Tr1 and Tr2 are connected to one another and are further connected to a constant current source I. The first input potential IN1 is input to the base region 22 of Tr1 (through its base contact region 15) and the second input potential IN2 is input to the base region 23 of Tr2 (through its base contact region 16).

The connecting arrangement for the second embodiment (FIG. 3) is similar to the connecting arrangement explained above for the first embodiment (FIG. 2). In particular, elements common to FIGS. 2 and 3 are represented by the same reference numerals and are identically connected. The connections of the additional collector regions and back gate electrodes provided in the second embodiment (FIG. 3) will now be explained. The additional collector region 24' provided in Tr1 is connected to the other collector region 24 in Tr1, and the additional collector region 25' provided in Tr2 is connected to the other collector region 25 in Tr2. Similarly, the additional back gate electrode 28' provided in Tr1 is connected to the other back gate electrode 28 in Tr1, and the additional back gate electrode 29' provided in Tr2 is connected to the other back gate electrode 29 in Tr2. Thus, a first output potential OUT1 is obtained from a node commonly connecting the two collector regions 24 and 24' of Tr1 and the two back gate electrodes 29 and 29' of Tr2, while a second output potential OUT2 is obtained from a node commonly connecting the two collector regions 25 and 25' of Tr2 and the two back gate electrodes 28 and 28' of Tr1.

Next, the operation of the differential amplifier of the present invention will be explained with reference to FIG. 1. As an example, if a relatively high level input signal is input as IN1 and a relatively low level input signal is input as IN2, the collector current of the first transistor 11 is reduced while the collector current of the second transistor 12 is increased. As a result, the collector voltage of the first transistor 11 (appearing as the first output potential OUT1) is relatively low while the collector voltage of the second transistor 12 (appearing as the second output potential OUT2) is relatively high.

The operation as described thus far is similar to that of a conventional differential amplifier. Namely, the voltage difference between the two input signals IN1 and IN2 is amplified and this amplified signal is output as the voltage difference between the two output signals OUT1 and OUT2. However, the transistors used in the differential amplifier of the present invention each have a back gate above their base region between their emitter and collector regions. By applying a suitable voltage to the back gate in accordance with the operation of such a transistor, the amplification factor of the transistor can be enhanced. In the present invention, the differential amplifier circuit is designed so that the amplification factor is further enhanced through the operation of the two transistors by using this property.

That is, when a relatively high level signal is input as IN1 and a relatively low level signal is input as IN2, the collector voltage of the first transistor 11 drops due to a reduction in the collector current of the first transistor 11. As a result, the voltage applied to the back gate 29 of the second transistor 12 drops and this broadens its channel region, which is formed in the base region between the collector region 25 and emitter region 27. Accordingly, the current driving capability of the second transistor 12 is increased so its collector current is also increased. Additionally, the increase in the collector current of the second transistor 12 causes the collector voltage of the second transistor 12 to increase. As a result, the voltage applied to the back gate 28 of the first transistor 11 is increased and this narrows its channel region, which is formed in the base region between the collector region 24 and emitter region 26. Accordingly, the current driving capability of the first transistor 11 is reduced so its collector current is also reduced.

The positive feedback performed in the differential amplifier of the present invention enhances the operation of the transistors 11 and 12 so that the amplification operation is performed at high speed and the amplitude of the output becomes large. Therefore, the amplification factor of the differential amplifier is enhanced and the operation of the circuit is stabilized.

Furthermore, each transistor used in the second embodiment of the present invention (FIG. 3) includes two back gates and two collector regions, and thus has two channel regions. In such a transistor, when the voltage applied to both of its back gates decreases, both of the corresponding channel regions are broadened to increase the current driving capability of the transistor. As a result, the gain of the transistors used in the second embodiment (FIG. 3) is even higher than the gain for those used in the first embodiment (FIG. 2). Accordingly, the positive feedback performed in the differential amplifier of the second embodiment further enhances the operation of the transistors Tr1 and Tr2 so that the amplification operation is performed at an even higher speed and the amplitude of the output becomes larger (as compared with the first embodiment). Therefore, the amplification factor of the differential amplifier of the second embodiment is further enhanced.

Figure 6:
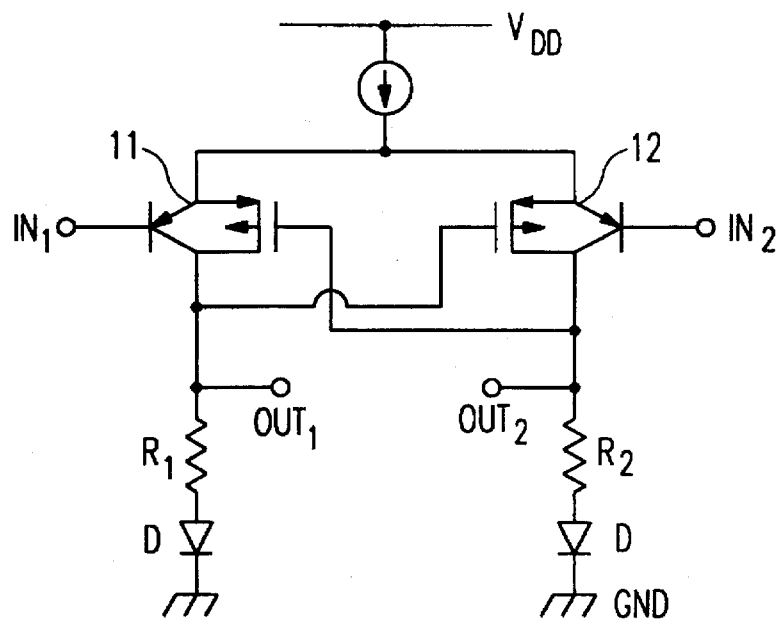
FIG. 6 is a circuit diagram showing a modification to the present invention.
Figure 7:
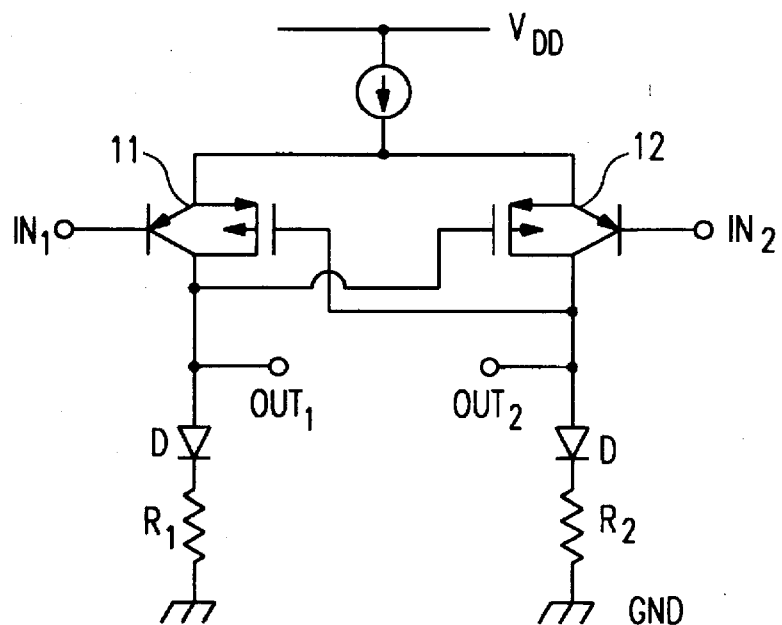
FIG. 7 is a circuit diagram showing another modification to the present invention.

The embodiments of the present invention described above relate to the use of PNP transistors formed in N-type well regions. However, NPN transistors, whose conduction type is opposite to that of PNP transistors, could obviously be used. In such a situation, the locations of the current source and load elements would be reversed (i.e., each load dement would be connected between one of the transistors and a supply voltage and the current source would be connected between the transistors and a ground potential). Additionally, the load elements in the above-described embodiments could be connected to a potential other than the ground potential. In fact, each load element could be connected to a different potential to provide different bias voltages to the two transistors. Furthermore, a voltage dropping device, such as a diode or the like, may be added to the differential amplifier circuit to adjust a bias voltage to be applied to a back gate. As shown in FIG. 7, such a voltage dropping device D could be connected between the collector of each transistor (24 or 25) and the corresponding resistor (R1 or R2). Alternatively, as shown in FIG. 6, the voltage dropping device D could be connected between each resistor (R1 or R2) and the ground potential. This voltage dropping device is added to the differential amplifier to adjust the bias voltage applied to the back gate, whereby the voltage applied to the back gate can be set for optimal operation. For example, the current driving capability of each transistor can be further controlled to provide stabilized operation.

In the present invention, the transistors used in a differential amplifier each comprise a device having a back gate electrode that is formed above the base region of a bipolar transistor between the emitter and collector regions. Additionally, each back gate electrode is connected to the collector or emitter of the other transistor so that a positive feedback is performed in such a direction that the operation of each transistor is enhanced. As a result of this design, the transistors can operate at high speed and the amplitude of the output is increased. Accordingly, the amplification factor of the differential amplifier circuit can be enhanced and circuit operation can be stabilized. Accordingly, there can be provided a semiconductor integrated circuit containing a differential amplifier that has both an enhanced degree of circuit integration and a more stable operation, as compared with a differential amplifier constructed of conventional bipolar transistors or FETs.

While there has been illustrated and described what are presently considered to be the preferred embodiments of the present invention, it will be understood by those skilled in the art that various modifications may be made, and equivalents may be substituted, without departing from the true scope of the invention. Additionally, many modifications may be made to adapt a particular situation or material to the teachings of the present invention without departing from the central inventive concept described herein. Therefore, it is intended that the present invention not be limited to the particular embodiment disclosed as the best mode contemplated for carrying out the invention, but that the invention include all embodiments falling within the scope of the appended claims.

What is claimed is:

1. A differential amplifier circuit comprising:
    a first transistor including:
        a first base region of a first conductivity type;
        a first emitter region of a second conductivity type, opposite to the first conductivity type, formed in a surface of said first base region;
        a first collector region of the second conductivity type formed in said surface of said first base region so as to be spaced apart from said first emitter region; and
        a first conductive region formed over a first insulating film, said first insulating film being formed on said surface of said first base region at least between said first emitter region and said first collector region; a second transistor including:
        a second base region of the first conductivity type;
        a second emitter region of the second conductivity type formed in a surface of said second base region;
        a second collector region of the second conductivity type formed in said surface of said second base region so as to be spaced apart from said second emitter region, said second collector region being coupled to said first conductive region of said first transistor; and
        a second conductive region formed over a second insulating film, said second insulating film being formed on said surface of said second base region at least between said second emitter region and said second collector region, said second conductive region being coupled to said first collector region of said first transistor;
    a constant current source connected to said first emitter region of said first transistor and to said second emitter region of said second transistor;
    a first load element connected between said first collector region of said first transistor and a first voltage source;
    a second load element connected between said second collector region of said second transistor and a second voltage source;
    a first input connected to said first base region of said first transistor;
    a second input connected to said second base region of said second transistor;
    a first output connected to said first collector region of said first transistor; and
    a second output connected to said second collector region of said second transistor.

2. The differential amplifier circuit according to claim 1, wherein the first transistor further includes:
    a third collector region of the second conductivity type formed in said surface of said first base region so as to be spaced apart from said first emitter and collector regions, said third collector region being coupled to said first collector region, and
    a third conductive region formed over a third insulating film, said third insulating film being formed on said surface of said first base region at least between said first emitter region and said third collector region, said third conductive region being coupled to said first conductive region; and the second transistor further includes:
    a fourth collector region of the second conductivity type formed in said surface of said second base region so as to be spaced apart from said second emitter and collector regions, said fourth collector region being coupled to said second collector region, and
    a fourth conductive region formed over a fourth insulating film, said fourth insulating film being formed on said surface of said second base region at least between said second emitter region and said fourth collector region, said fourth conductive region being coupled to said second conductive region.

3. The differential amplifier circuit according to claim 1, further comprising:
    a first voltage drop element coupled between said first collector region of said first transistor and said first load element; and
    a second voltage drop element coupled between said second collector region of said second transistor and said second lead element.

4. The differential amplifier circuit according to claim 1, further comprising:
    a first voltage drop element coupled between said first lead element and said first voltage source; and
    a second voltage drop element coupled between said second lead element and said second voltage source.

5. The differential amplifier circuit according to claim 1, wherein said first conductivity type is N-type, and said first and second voltage sources are at a ground potential.

6. The differential amplifier circuit according to claim 1, wherein said first conductivity type is P-type, and said first and second voltage sources are at a power source potential.

7. A differential amplifier comprising:
   a first transistor including:
   a first well region era first conductivity type serving as a first base region, said first well region being formed in a semiconductor substrate of a second conductivity type opposite to the first conductivity type;
   first collector and emitter regions of the second conductivity type formed in said first base region so as to be spaced apart from each other; and
   a first gate electrode formed over an insulating film on said semiconductor substrate between said first collector region and said first emitter region; a second transistor including:
   a second well region of the first conducive type serving as a second base region, said second well region being formed in said semiconductor substrate and being separated from said first well region;
   second collector and emitter regions of the second conductivity type formed in said second base region so as to be spaced apart from each other; and
   a second gate electrode formed over an insulating film on said semiconductor substrate between said second collector region and said second emitter region;
   means for supplying a constant current to a node, said first emitter region of said first transistor and said second emitter region of said second transistor being connected to said node;
   means for coupling a first load element between said first collector region of said first transistor and a voltage source;
   means for coupling a second load element between said second collector region of said second transistor and said voltage source;
   means for coupling said first collector region of said first transistor to said second gate electrode of said second transistor;
   means for coupling said second collector region of said second transistor to said first gate electrode of said first transistor;
   means for inputting a first input to said first base region of said first transistor;
   means for inputting a second input to said second base region of said second transistor;
   means for outputting a first output from said first collector region of said first transistor; and
   means for outputting a second output from said second collector region of said second transistor.

8. The differential amplifier according to claim 7, wherein the first transistor further includes:
   a third collector region of the second conductivity type formed in said first base region so as to be spaced apart from said first collector and emitter regions, said third collector region being coupled to said first collector region, and
   a third gate electrode formed over an insulating film on said semiconductor substrate between said first emitter region and said third collector region, said third gate electrode being coupled to said first gate electrode; and
   the second transistor further includes:
   a fourth collector region of the second conductivity type formed in said second base region so as to be spaced apart from said second collector and emitter regions, said fourth collector region being coupled to said second collector region, and
   a fourth gate electrode formed over an insulating film on said semiconductor substrate between said second emitter region and said fourth collector region, said fourth gate electrode being coupled to said second gate electrode.

9. The differential amplifier according to claim 7, further comprising:
   means for coupling a first voltage drop element between said first collector region and said voltage source; and
   means for coupling a second voltage &op element between said second collector region and said voltage source,
   wherein said first voltage drop element is connected in series with said first load element and said second voltage drop element is connected in series with said second load element.

10. The differential amplifier according to claim 7, wherein said first conductivity type is N-type, and said voltage source is at a ground potential.

11. The differential amplifier according to claim 7, wherein said first conductivity type is P-type, and said voltage source is at a power source potential.

12. In a differential amplifier circuit of the type having:
   a first transistor having a first base region of a first conductivity type, a first emitter region of a second conductivity type, opposite that of the first conductivity type, and a first collector region of the second conductivity type;
   a second transistor having a second base region of the first conductivity type, a second emitter region of the second conductivity type, and a second collector region of the second conductivity type;
   a first load element coupled between said first collector region of said first transistor and a first voltage source,
   a second load element coupled between said second collector region of said second transistor and a second voltage source;
   a constant current source which is commonly connected to said first emitter region and said second emitter region;
   a first input coupled to said first base region of said first transistor;
   a second input coupled to said second base region of said second transistor;
   a first output coupled to said first collector region of said first transistor; and
   a second output coupled to said second collector region of said second transistor,
   the improvement which comprises:
   a first gate electrode formed over an insulating film on said first base region between said first emitter region and said first collector region;
   a second gate electrode formed over art insulating film on said second base region between said second emitter region and said second collector region;
   means for coupling said first gate electrode of said first transistor to said second collector region of said second transistor; and
   means for coupling said second gate electrode of said second transistor to said first collector region of said first transistor.

13. The differential amplifier circuit according to claim 12, further comprising:
- a third gate electrode formed over an insulating film on said first base region between said first emitter region and a third collector region of said first transistor;
- a fourth gate electrode formed over an insulating film on said second base region between said second emitter region and a fourth collector region of said second transistor;
- means for coupling said third gate electrode to said first gate electrode; and
- means for coupling said fourth gate electrode to said second gate electrode.

14. The differential amplifier circuit according to claim 12, further comprising:
- a first voltage drop element coupled between said first collector region and said first voltage source; and
- a second voltage drop element coupled between said second collector region and said second voltage source,
- wherein said first voltage drop element is connected in series with said first load element and said second voltage drop element is connected in series with said second load element.

15. The differential amplifier circuit according to claim 12, wherein said first conductivity type is N-type, and said first and second voltage sources are at a ground potential.

16. The differential amplifier circuit according to claim 12, wherein said first conductivity type is P-type, and said first and second voltage sources are at a power source potential.

17. A differential amplifier comprising:
- a first transistor including:
  - a first buried layer of a first conductivity type formed in a semiconductor substrate of a second conductivity type, opposite to the first conductivity type;
  - a first well region of the first conductivity type serving as a first base region formed in said substrate so as to be extended to said first buried layer;
  - a first base contact region formed in said first well region so as to be extended to said first buried layer;
  - first collector and emitter regions of the second conductivity type formed in a surface of said first well region so as to be spaced apart from each other and said first base contact region; and
  - a first conductive region formed over an insulating film on said first well region between said first collector region and said first emitter region; a second transistor including:
  - a semiconductor substrate of the second conductivity type;
  - a second buried layer of the first conductivity type formed in said semiconductor substrate;
  - a second well region of the first conductivity type serving as a second base region formed in said substrate and separated from said first well region so as to be extended to said second buried layer;
  - a second base contact region formed in said second well region so as to be extended to said second buried layer;
  - second collector and emitter regions of the second conductivity type formed in a surface of said second well region so as to be spaced apart from each other and said second base contact region, said second collector region being connected to said first conductive region of said first transistor; and
  - a second conductive region formed over an insulating film on said semiconductor substrate between said second collector region and said second emitter region, said second conductive region being connected to said first collector region of said first transistor;
- a constant current source connected to said first emitter region of said first transistor and said second emitter region of said second transistor;
- a first resistor coupled between said first collector region of said first transistor and a voltage source;
- a second resistor coupled between said second collector region of said second transistor and said voltage source;
- a first input coupled to said first base contact region of said first transistor;
- a second input coupled to said second base contact region of said second transistor;
- a first output coupled to said first collector region of said first transistor; and
- a second output coupled to said second collector region of said second transistor.

18. The differential amplifier according to claim 17, wherein the first transistor further includes:
- a third collector region of the second conductivity type formed in a surface of said first well region so as to be spaced apart from said first collector and emitter regions and said first base contact region, said third collector region being coupled to said first collector region, and
- a third conductive region formed over an insulating film on said first well region between said first emitter region and said third collector region, said third conductive region being coupled to said first conductive region; and the second transistor further includes:
- a fourth collector region of the second conductivity type formed in a surface of said second well region so as to be spaced apart from said second collector and emitter regions and said second base contact region, said fourth collector region being coupled to said second collector region, and
- a fourth conductive region formed over an insulating film on said first well region between said second emitter region and said fourth collector region, said fourth conductive region being coupled to said second conductive region.

19. The differential amplifier according to claim 17, further comprising:
- a first voltage drop element coupled between said first collector region and said voltage source; and
- a second voltage drop element coupled between said second collector region and said voltage source,
- wherein said first voltage drop element is connected in series with said first resistor and said second voltage drop element is connected in series with said second resistor.

20. The differential amplifier according to claim 17, wherein said first conductivity type is N-type, and said voltage source is at a ground potential.

21. The differential amplifier according to claim 17, wherein said first conductivity type is P-type, and said voltage source is at a power source potential.

* * * * *